United States Patent
Fuhrmann et al.

(10) Patent No.: US 8,161,433 B2
(45) Date of Patent: Apr. 17, 2012

(54) UTILIZING AN UNSAT PROOF FOR MODEL CHECKING

(75) Inventors: Oded Fuhrmann, Haifa (IL); Shlomo Hoory, Haifa (IL); Ohad Shacham, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 345 days.

(21) Appl. No.: 12/501,501

(22) Filed: Jul. 13, 2009

(65) Prior Publication Data
US 2011/0010139 A1    Jan. 13, 2011

(51) Int. Cl.
*G06F 17/50*    (2006.01)
(52) U.S. Cl. .......................... 716/101; 716/104; 716/113
(58) Field of Classification Search .................. 716/101, 716/104, 113
See application file for complete search history.

(56) References Cited

U.S. PATENT DOCUMENTS

| 7,340,702 | B2 | 3/2008 | Wang | |
|---|---|---|---|---|
| 7,742,907 | B2 * | 6/2010 | Gupta et al. | 703/14 |

OTHER PUBLICATIONS

K.L. McMillan, "Exploiting SAT solvers in unbounded model checking", Author: K.L. Mc Millan Source: Cadence Berkeley Labs http://www.kenmcmil.com/cav03tut.ppt, (2007).

Wojciech Penczek et al., "SAT-based Unbounded Model Checking of Timed Automata", Source: Institute of Computer Science, PAS, (2002).

Cabodi et al., "Stepping forward with interpolants in unbounded model checking", Source: International Conference on Computer Aided Design; Proceedings of the 2006 IEEE/ACM international conference on Computer-aided design, San Jose, California; Session: Advances in model checking; pp. 772-778, Year of Publication: 2006.

* cited by examiner

*Primary Examiner* — Thuan Do
(74) *Attorney, Agent, or Firm* — Ziv Glazberg (57) ABSTRACT

A proof of unsatisfiability associated with a bounded model may be extended to apply to another bounded model having a larger bound. In some exemplary embodiments, an unbounded model may be proved using one or more such extensions. A proof may be reordered in order to decrease its size and increase the productivity of systems that utilize it. The proof may be reorder by a natural temporal order of cycles.

25 Claims, 8 Drawing Sheets

UTILIZING AN UNSAT PROOF FOR MODEL CHECKING

BACKGROUND

The present disclosure relates to model checking, in general, and to SAT-based model checking, in particular.

State of the art computerized components are very complex and require extensive quality assurance checks. One of the commonly used techniques is formal verification in which the computerized component is modeled and is examined by a model checker. The model describes all possible behaviors of the computerized component based on inputs from the environment and calculations performed by the computerized component itself. Most components are represented by cycled models in which the state of the component may differ from one cycle to the other. It will be noted that the computerized component may be a software component, firmware component, hardware component or the like. It will be further noted that in some cases the component to be verified may be a business method, user interaction, communication protocol or any other form of activity or computation that may be expressed formally using a model.

A model checker checks that the model holds a predetermined specification property. An exemplary specification property may be that a triggered event is always handled by the component or that a certain variable is never assigned a predetermined value. The specification property may be attributed to one or more cycles. For simplicity, the current disclosure discusses mainly a specification property that is associated to a cycle. However, it should be understood that the disclosed subject matter is not limited to such a specification property. For example, the specification property may be associated with more than one cycle, such as for example, after a flag is raised in a cycle, an alert is issued within a predetermined number of cycles.

One form of model checking utilizes a Bounded Model Checker (BMC). The bounded model checker determines whether the specification property holds for a predetermined number of cycles. A bounded model is a model which has a bounded number of cycles. A bounded model associated with an unbounded model may be determined by truncating behaviors of the model in every cycle that exceeds a predetermined bound. While the BMC may falsify the specification property by determining that in a given one or more cycles the specification property is not held, it cannot prove that the specification is held for the model, as the number of cycles is bounded. The BMC can only provide a proof that the specification is held for every cycle of within the predetermined number of cycles.

One family of BMC engines utilize a SAT solver for solving a Boolean satisfiability problem that is associated with the predetermined number of cycles. The Boolean satisfiability problem is formulated in a Conjunctive Normal Form (CNF) formula.

Although BMC engines are usually faster and more efficient than other types of model checking engines, they are unable to provide a proof that the model holds the specification property in each and every possible behavior. The BMC engines allow only to falsify a specification property by providing a satisfying assignment of the CNF or to provide a proof that given a predetermined bound on the number of cycles, the specification property holds. Many artisans believe that an efficient solution to performing an unbounded model checking may utilize a bounded model checker, such as a BMC that utilizes a SAT solver. It is also believed by many artisans that as a size of a proof is reduced, an efficiency of a method using the proof may increase. Therefore, it is a long felt need to provide for a process, machine or the like for reducing the size of a proof, and for a process, machine or the like for utilizing a SAT solver for performing an unbounded model checking.

BRIEF SUMMARY OF THE INVENTION

One exemplary embodiment of the disclosed subject matter is a computerized system comprising: a processor; an interface for receiving a proof of a conclusion associated with a CNF formula; the CNF formula representing a model and a specification property in a predetermined number of cycles; the proof comprising an initial axiom clause, a transition axiom clause and a deduction clause; and an invariant extractor module for identifying an invariant in the proof; the invariant is a portion of the proof; the invariant extractor module utilizes the processor for identifying the invariant.

Another exemplary embodiment of the disclosed subject matter is a method comprising: obtaining a proof of a conclusion associated with a CNF formula; the CNF formula representing a model and a specification property in a first predetermined number of cycles; the proof comprising an initial axiom clause, a transition axiom clause and a deduction clause; identifying an invariant in the proof; the identifying an invariant in the proof is performed by a processor; and determining the specification property holds for the model in a second predetermined number of cycles based on the invariant; whereby the proof of the conclusion associated with the CNF formula is transformed to provide a proof of the conclusion associated with an extended CNF formula representing the model and the specification property in the second predetermined number of cycles.

Yet another exemplary embodiment of the disclosed subject matter is a computer program product comprising: a computer readable medium; first program instruction for obtaining a proof of a conclusion associated with a CNF formula; the CNF formula representing a model and a specification property in a first predetermined number of cycles; the proof comprising an initial axiom clause, a transition axiom clause and a deduction clause; second program instruction for identifying an invariant in the proof; the identifying an invariant in the proof is performed by a processor; and third program instruction for determining the specification property holds for the model in a second predetermined number of cycles based on the invariant, wherein the first, second, and third program instructions are stored on the computer readable media.

Yet another exemplary embodiment of the disclosed subject matter is a method comprising: obtaining a comb from the at least one comb; the comb is associated with a proof of a conclusion clause of a CNF formula; the comb comprising a set of one or more clauses; the at least one comb representing a first list of an at least one deduction; the at least one deduction deduces the conclusion clause; identifying a first clause from the one or more clauses of the comb; the first clause comprising one literal which is not comprised in a reference clause; said identifying the first clause is determined by a processor; said reference clause is the conclusion clause; and determining a second clause; the second clause is characterized in that the first clause and the second clause deduce the reference clause; whereby the proof of the conclusion clause is transformed to a modified proof; the modified proof representing a second list of deductions different than the first list of deductions.

In some exemplary embodiments, said identifying the first clause and said determining the second clause are preformed iteratively; wherein in each iteration the reference clause is the second clause of the previous iteration.

In some exemplary embodiments, said identifying a first clause comprises: identifying a set of one or more clauses; and selecting the first clause from the set of one or more clauses based on a predetermined order function; whereby the second list of deductions represented by the modified proof is ordered based on the predetermined order function.

In some exemplary embodiments, said predetermined order function determines an order between two clauses based on an order of one or more cycles associated with the two clauses.

In some exemplary embodiments, the deduction is resolution of clauses.

In some exemplary embodiments, the method further comprises eliminating double pivot variables from the comb.

In some exemplary embodiments, the conclusion clause comprises a literal; the method further comprising eliminating the literal from a clause of the comb.

In some exemplary embodiments, the method further comprises extracting the comb from the proof.

In some exemplary embodiments, the proof of a conclusion is a proof of unsatisfiability.

In some exemplary embodiments, the method is performed iteratively until an iteration in which the modified proof is the proof.

Another exemplary embodiment of the disclosed subject matter is a computerized system comprising: a processor; an interface for receiving a proof of a conclusion clause of a CNF formula; the proof comprising an at least one comb; the at least one comb comprising a set of one or more clauses; the at least one comb representing a first list of an at least one deduction; the at least one deduction deduces the conclusion clause; a comb extractor module for extracting a comb from the proof; and a proof reordering module for rebuilding a modified list of deductions that deduce the conclusion clause; said proof reordering module utilizes said processor.

In some exemplary embodiments, said proof reordering module further comprises an ordering function module for determining an order between two or more clauses based on a predetermined ordering function.

In some exemplary embodiments, an order determined by the predetermined ordering function is affected by a cycle number associated with a portion of a clause.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to prove a specification property is held for a model with a first predetermined bound on the number of the cycles based on a proof that the specification property is held for a model with a second predetermined bound on the number of the cycles, where the second predetermined bound is lower than the first predetermined bound. Another technical problem dealt with by the disclosed subject matter is to provide a proof that a specification property is held in a model based on one or more proofs that the specification property is held in a one or more bounded models associated with the model. Yet another technical problem dealt with by the disclosed subject matter is to decrease a size of a proof of unsatisfiability provided by a SAT solver.

One technical solution is to extract one or more invariants from a proof of unsatisfiability associated with a first bounded model. The invariant may be utilized to provide a proof of unsatisfiability of a second model. The second model may be an unbounded model or a second bounded model having a higher predetermined bound than the bound of the first bounded model. Another technical solution is to reorder an order of deductions in a proof in order to decrease the size of the proof. Note that the size of the proof is affected by a number or literals in each clause in the proof. The reorder operation may utilize an order associated with an temporal order, order of cycles, a structure of the model and the like. Yet another technical solution is to extract one or more invariants from a set of proofs associated with a set of bounded models. The one or more invariants may be utilized to prove unsatisfiability of a specification property in respect to an unbounded model.

One technical effect of utilizing the disclosed subject matter is extending a proof of unsatisfiability associated with a first bounded model such that the extended proof is associated with a second bounded model having a higher bound than the first bounded model. Another technical effect of utilizing the disclosed subject matter is decreasing the size of a proof of unsatisfiability. Yet another effect of utilizing the disclosed subject matter is to increase efficiency of an algorithm utilizing a proof of unsatisfiability. An additional effect of utilizing the disclosed subject matter is providing a complete proof that an unbounded model holds a specification property.

Figure 1:
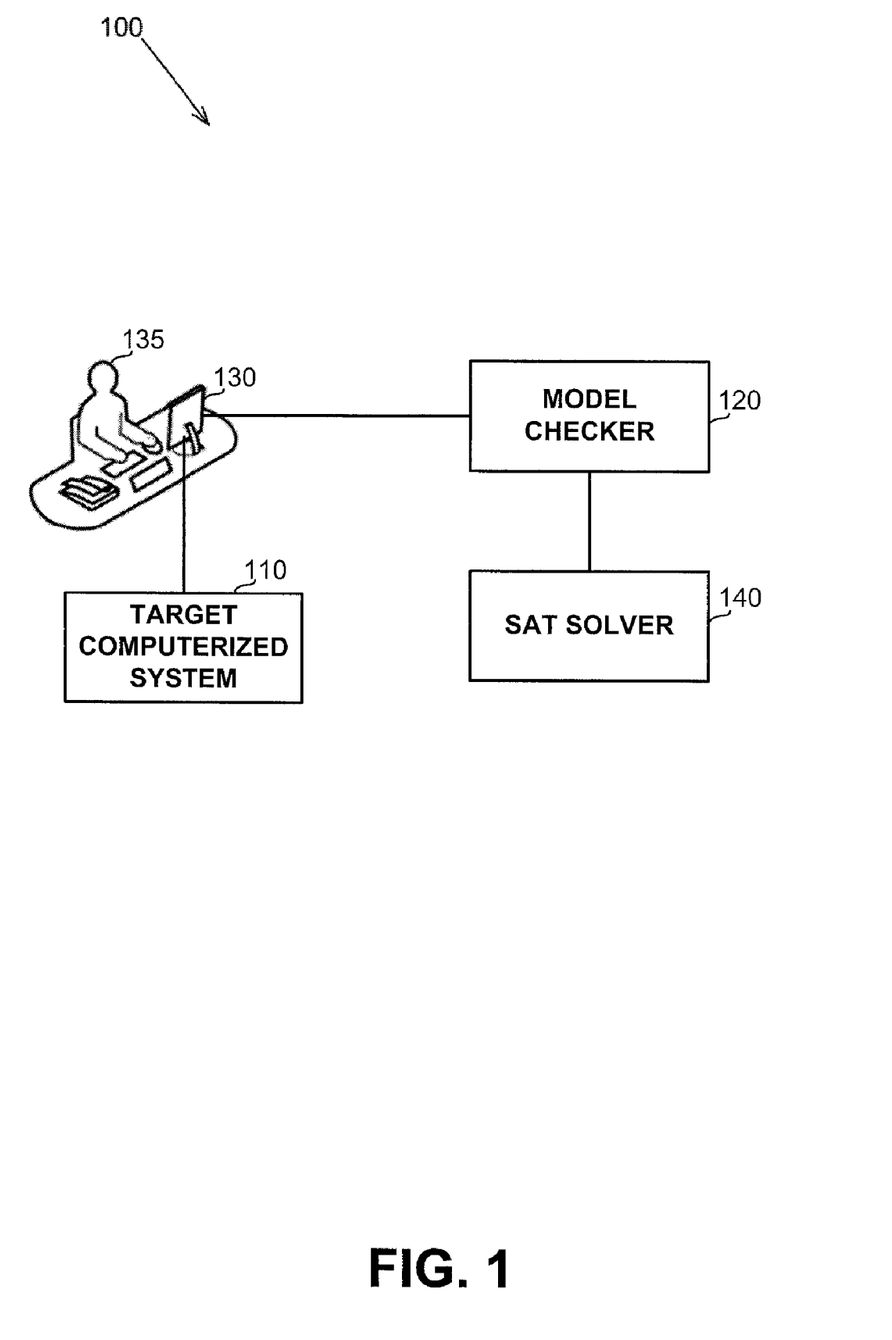
FIG. 1 shows a computerized environment in which the disclosed subject matter is used, in accordance with some exemplary embodiments of the subject matter.

Referring now to FIG. 1 showing a computerized environment in which the disclosed subject matter is used, in accordance with some exemplary embodiments of the subject matter. A computerized environment 100 comprises a target system 110. The target system 110 may be a computerized system such as hardware device, a firmware component, a software module, a communication protocol, a business method or the like. In some exemplary embodiments, the target system 110 is a target computerized system.

A user 135, such as for example a verification engineer, a quality assurance personnel or the like, may determine a model (not shown) and a specification property (not shown). The model describes all possible behaviors of the target computerized system 110, such as for example using a formal language. In an exemplary embodiment, a VHDL description of the model is utilized. In other exemplary embodiments other programming or descriptive languages may be utilized, such as for example state diagram, Unified Modeling Language (UML), C, systemC or the like. The user 135 may further determine a specification property to be examined in respect to the target system 110. The specification property may be described using any formal or descriptive language such as for example Process Specification Language, Sugar, VHDL, C, UML, state diagram, flow chart or the like. The user may utilize a terminal 130 such as a personal computer, laptop, modeling computer or the like to determine the model or the specification property.

The user 135 may further utilize the terminal 130 to provide the model and the specification property to the model checker 120. The model checker 120 may determine whether the model holds the specification property in each possible behavior of the model. The model checker 120 may further provide a counter-example which exemplifies a possible behavior of the model (and of the target system 110) which does not hold the specification property.

The model checker 120 may utilize a BMC in order to check the model. In an exemplary embodiment of the disclosed subject matter, the BMC is a SAT solver 140. The model checker 120 may determine a CNF formula associated with a bounded model based on the model and the specification property. The SAT solver 140 may provide a proof of unsatisfiability or a counter-example. The model checker 120 may utilize the proof of unsatisfiability and extend it to be associated with a model having a higher bound than the bounded model examined by the SAT solver 140.

In some exemplary embodiments of the disclosed subject matter, the CNF formula is a conjunction of one or more clauses. A clause is disjunction of literals. A literal is a value of a Boolean variable. For example, there are two literals associated with the variable v, the true literal v and the false literal −v. An exemplary CNF may be (a or −b) and (b or −c), which comprise a conjunction of two clauses, a first clause (a or −b) and a second clause (b or −c). The SAT solver 140 may provide a satisfying assignment to the CNF formula. For example, in the aforementioned exemplary CNF one exemplary satisfying assignment may be (a,b,c). Another exemplary satisfying assignment may be (−a, −b, −c). In case the CNF cannot be satisfied, the SAT solver 140 may provide a proof of unsatisfiability. A proof of unsatisfiability, also referred to as a proof, may be a Directed Acyclic Graph (DAG) comprising a node corresponding to a clause. The proof of unsatisfiability may describe a series of one or more conclusions based on two or more clauses that are associated with the CNF and cannot be satisfied using the same values of the variables. Consider the following exemplary unsatisfiable CNF: (a or c) and (a or b) and (−b or −c) and (−a or c) and (−c) and (−d or e). One exemplary proof may of the exemplary unsatisfiable CNF be the clauses (a or c), (a or b), (−b or −c), (−a or c) and (−c), as those three clauses cannot be satisfied at the same time. In some cases several different potential proofs exists and their size may vary. In case the proof is utilized for any post-solution activity, its size may affect the speed, the memory consumption and the like of the post-solution activity.

In some exemplary embodiments, the BMC may determine a CNF that comprises for each variable in the model a different variable corresponding to the value of the variable in a predetermined cycle. Consider an exemplary model having two Boolean variables: a and b. The CNF for three cycles may comprise six variables: $a\_1, a\_2, a\_3, b\_1, b\_2$ and $b\_3$.

The BMC may determine a CNF that may comprise an at least one init axiom clause which is directed to describing the value of the variables in the initial state of the component, i.e. in the first cycle. The CNF may further comprise an at least one transition axiom clause which is directed to describing the transition relation between a first state of the component in a first cycle and a second state of the component in the next cycle. For example, the transition axiom clause may determine that the value of a first variable is based on the value of one or more variables in the previous cycle. The CNF may yet further comprise one or more clauses describing the specification property that is verified. The BMC may determine a CNF such that a satisfying assignment of the CNF describes a behavior of the model in which the specification property is not held.

Figure 2:
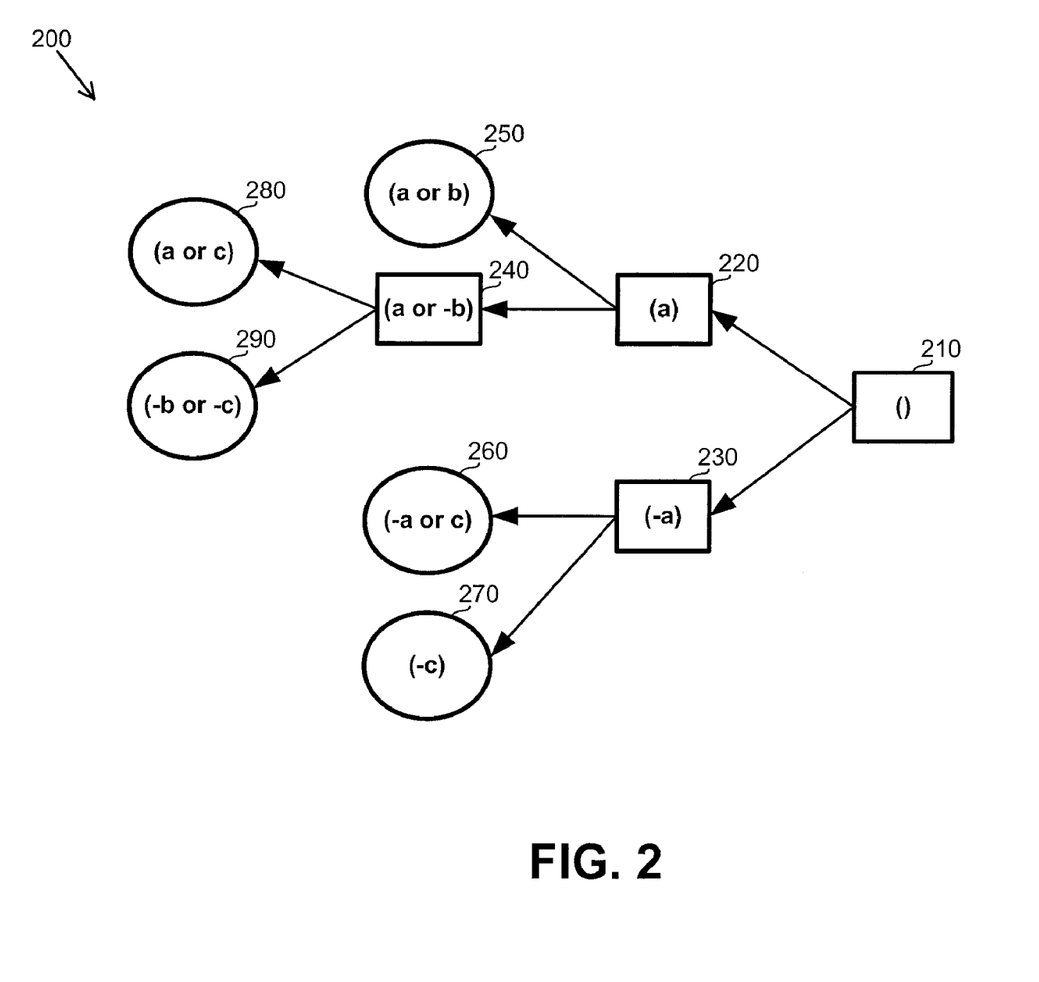
FIG. 2 shows a proof of unsatisfiability of a CNF formula, in accordance with some exemplary embodiments of the disclosed subject matter.

Referring now to FIG. 2 showing a proof of unsatisfiability of a CNF formula, in accordance with some exemplary embodiments of the disclosed subject matter. A proof 200 may be a DAG comprising a node corresponding to a clause. The proof 200 may describe a series of one or more conclusions based on two or more clauses. An outgoing edge from a first clause to a second clause exists if the second clause is utilized to deduce the first clause. The first clause may be referred to as a conclusion. The proof 200 is one exemplary proof refuting satisfiability of the aforementioned exemplary unsatisfiable CNF. The proof 200 represents a series of deductions leading to a conclusion that the CNF formula is unsatisfiable, represented by an node 210 associated with an empty clause. The node 210 may be deduced based on two nodes—node 220 associated with clause (a) and node 230 associated with clause (−a).

The deduction is based on a logic method known as resolution of clauses. A first clause and a second clause may deduce a resolution clause if they have one variable which needs to be satisfied by a first literal in the first clause and by a second literal in the second clause. The first and second literals are opposite literals. The variable may be referred to as a pivot variable. The resolution clauses comprises a disjunction of all literals in the first clause and the second clause aside from the literals associated with the pivot variable. For example, the clause (a or b or c) and the clause (−a or d or e) may deduce a resolution clause of (b or c or d or e).

Referring again to the proof 200, the node 220 is associated with a resolution clause between a clause (−a or c) and a clause (a or −b). The clause (a or b) is associated with node 250 and the clause (a or −b) is associated with node 240. The node 240 is based on a resolution between to clauses (a or c) and (−b or −c) associated with nodes 280 and 290 respectively. The node 230 is based on a resolution clause of (−a or c) and (−c) associated with nodes 260 and 270 respectively. It will be noted that leaves of the proof 200, such as nodes 250, 280, 290, 260, 270, are associated with clauses comprised in the CNF. Non-leaf nodes of the proof 200, such as nodes 240, 220, 230 and 210 are based on deductions such as for example resolution of two clauses. The root of the proof 200, the node 210, is a conclusion based on the leafs of the proof. In the exemplary embodiment, the conclusion is that the CNF is unsatisfiable. Therefore, the node 210 is associated with an empty clause.

In the current specification, a comb refers to a route in the DAG beginning from the root node, also referred to as the conclusion, and ending in one leaf. The comb is further defined in that each node of the comb has an in-degree of at most one degree. The comb further comprises any immediate successor of any node in the route. For example, one exemplary comb of the proof 200 is based on the route between the node 210 and the node 280. The exemplary comb comprises all the nodes in the route, i.e. nodes 210, 220, 240 and 280. The exemplary comb further comprises the node 250, as it is a direct successor of the node 220; the node 290 as it is a direct successor of the node 240; and the node 230 as it is a direct successor of the node 210. A comb may be referred to as a directed tree whose root is the conclusion and leafs are basic assumptions. A basic assumption is a clause which must be satisfied in order to satisfy the CNF associated with the proof that the comb was extracted from. In some exemplary embodiments, the basic assumption may be an axiom such as initial axiom or transition axiom. In some exemplary embodiments, a basic assumption may be a conclusion deduced based on other basic assumptions.

A comb may represent a list of deductions, such as resolutions, performed in order to deduce the conclusion based on other deductions or axioms. Referring again to the exemplary comb, the conclusion that the CNF is unsatisfiable is based on some axioms such as associated with the nodes 250, 280 and 290 (either initial axioms or transition axioms). The conclusion is further based on some deductions such as associated with the node 230.

Figure 3:
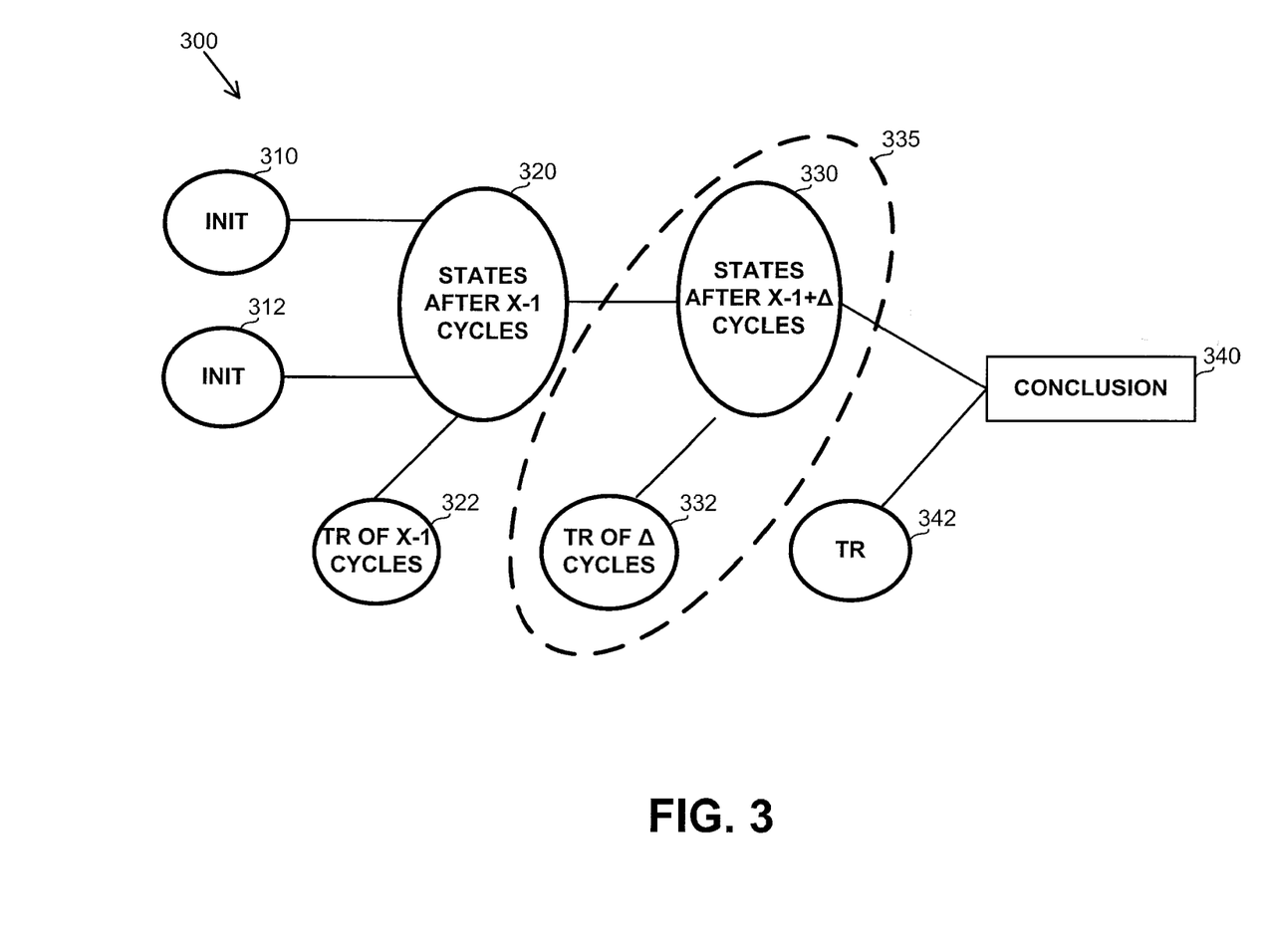
FIG. 3 shows an extended proof of unsatisfiability, in accordance with some exemplary embodiments of the subject matter.

Referring now to FIG. 3 showing an extended proof of unsatisfiability, in accordance with some exemplary embodiments of the subject matter. An extended proof 300 comprises a conclusion 340 based on one or more initial states described by init axiom clauses 310, 312, and transition relation between a first state and a second state described by transition axiom clauses 322, 332 and 342. It will be noted that in some exemplary embodiment the number of the init axiom clauses or transition axiom clauses may be dozens, hundreds, thousands or the like. In some exemplary embodiments, a clause such as 310, 322 may comprise more than one clause. In some exemplary embodiments of the disclosed subject matter the conclusion 340 may be that the CNF formula is unsatisfiable. In other exemplary embodiments, the conclusion 340 may be that the CNF formula deduces a specific partial assignment or the like.

An original proof (not shown) may deduce the conclusion 340 in a bound of a predetermined number of cycles, such as for example X cycles. The original proof may comprise the init axiom clauses 310, 312 for describing all possible initial states of a model associated with the CNF formula that is examined. The transition relation of the model may be represented using additional clauses. For example, the transition relation representing a predetermined number of cycles, such as X−1 cycles, may be represented by the transition axiom clause 322. The original proof may deduce based on the init axiom clauses 310, 312 and based on the transition axiom clause 322 a set of one or more states of the model after X−1 cycles. The set of one or more states may be represented by a one or more clauses 320, also referred to as states after X−1 cycles. Based on the states after X−1 cycles 320 and one or more transition axiom clauses for advancing the model from a cycle to a next cycle, such as for example from cycle X−1 to cycle X, represented by TR clause 342, the original proof shows a deduction of the conclusion 340.

The extended proof 300 is an extension of the original proof. The extended proof 300 deduces the conclusion 340 after a number of cycles greater than X. The extended proof 300 comprises the initial axiom clauses 310, 312, the transition axiom clause 322 for determining the state of the model after X−1 cycles 320. The extended proof 300 further comprises an extension of the proof 335 for adding a behavior of Δ (delta) cycles. The extended proof 300 further comprises one or more transition axiom clauses for advancing the model from a cycle to a next cycle, such as for example from cycle X−1+Δ to cycle X+Δ, represented by TR clause 342.

The extension of the proof 335 further comprises a deduction of the states of the model after X−1+Δ cycles 330 and a transition axiom clause for advancing the model from a cycle by additional Δ cycles 332.

The extended proof 300 is based on the original proof and an extension relating to additional delta cycles. The extended proof 300 utilizes an invariant (not shown). The invariant holds that if the conclusion 340 is held after X cycles, it will further be held after X+Δ cycles as well. This specific type of invariant is also referred to as a delta invariant.

It will be noted that the above exemplary extended proof is disclosed herein for exemplary purposes only. A clause in the extended proof may be represented by several clauses. A clause in the extended proof may further represent a group of clauses and is shown herein as a single clause for didactic purpose only.

It will be emphasized that not every proof may be extended as disclosed in the disclosed subject matter. In some exemplary proofs, an invariant such as a delta invariant, does not exist and the exemplary proofs may not be extendable using the disclosed subject matter.

Figure 4:
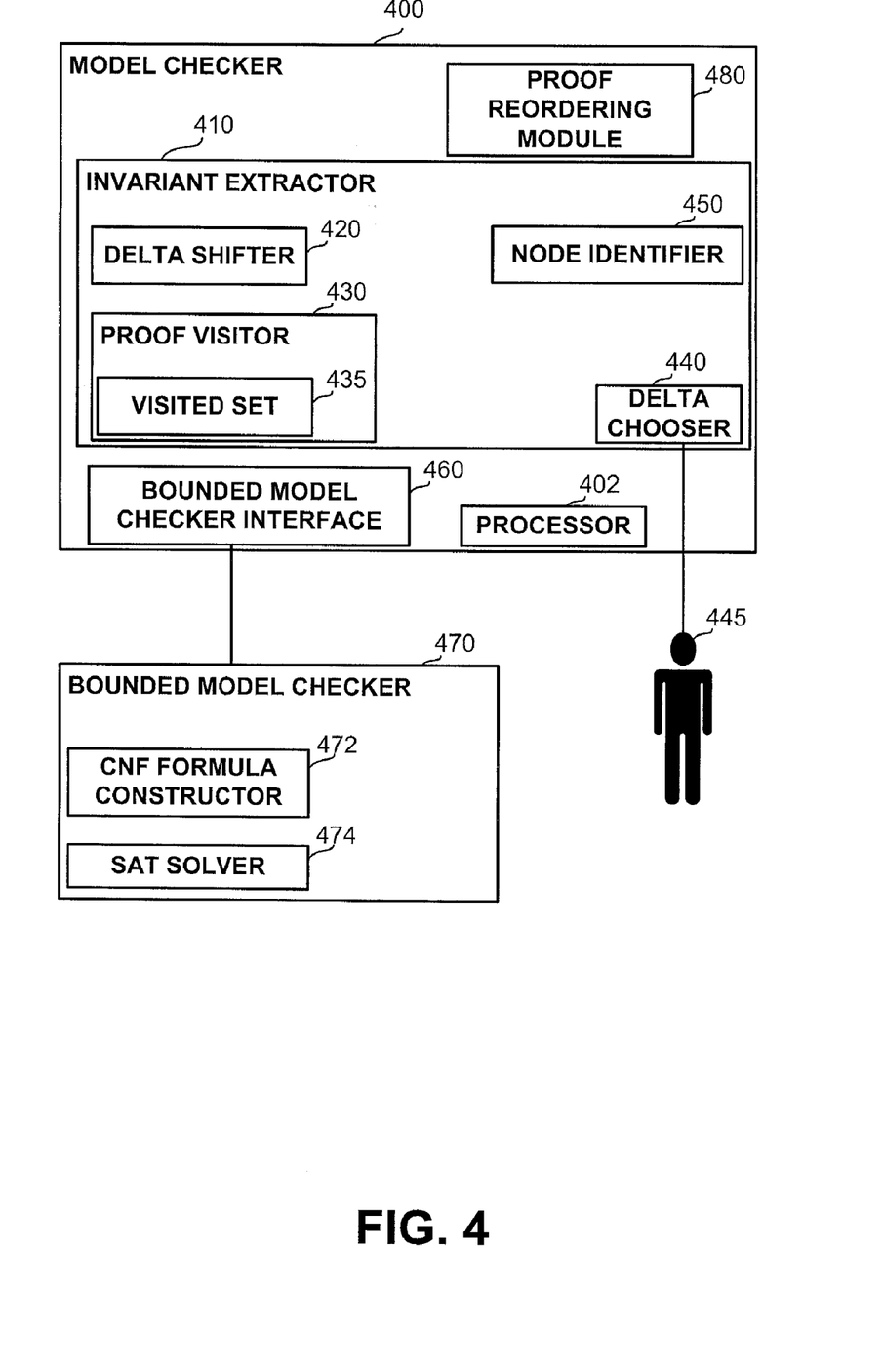
FIG. 4 shows a block diagram of a model checker, in accordance with some exemplary embodiments of the disclosed subject matter.

Referring now to FIG. 4 showing a block diagram of a model checker, in accordance with some exemplary embodiments of the disclosed subject matter. A model checker 400 for checking a model of a target system, such as a model defined by a verification engineer, in respect to a specification property, such as a specification property determined by a verification engineer. It will be noted that the model may be either an unbounded model or a bounded model.

The model checker 400 may comprise a processor 402 for performing computations required by the model checker 400 or any of its subcomponents. The processor 402 may be a Central Processing Unit (CPU), a microprocessor, an electronic circuit, an Integrated Circuit (IC) or the like.

The model checker 400 may further comprise a Bounded Model Checker interface 460 also referred to as a BMC interface. The BMC interface 460 enables the model checker to initiate an inspection of a bounded model associated with the model. The BMC interface 460 may utilize a Bounded Model Checker (BMC) 470 for determining whether the bounded model holds the specification property. The BMC interface 460 may be an Application Programming Interface (API), a proxy module, a communication protocol or the like. The BMC interface 460 may enable communication between the model checker 400 and the BMC 470 such as for initiating a bounded model checking verification, receiving an outcome or conclusion of the bounded model checking verification and the like.

The BMC 470 may comprise a CNF formula constructor 472 for determining a CNF formula associated with the bounded model and the specification property. For example, the CNF formula associated with a bounded model of X cycles may comprise X different variables associated with a single variable of the bounded model, each associated with the value of the single variable in a different cycle.

The BMC 470 may further comprise a SAT solver 474 to determine whether or not the CNF formula determined by the CNF formula constructor 472 is satisfiable. The SAT solver 474 may produce a proof of unsatisfiability in case the CNF formula is unsatisfiable. The BMC 470 may indicate to the model checker 400 that whether or not the bounded model holds the specification property. The BMC 470 may further send or transmit or otherwise transfer the proof of unsatisfiability to the model checker 400.

In some exemplary embodiments of the disclosed subject matter, the model checker 400 may comprise the BMC 470 or a portion thereof, such as the CNF formula constructor 472. In such exemplary embodiments, the BMC interface 460 may not be comprised by the model checker 400. In some cases a different interface, such as a SAT solver interface (not shown) may be comprised by the model checker 400 for enabling the model checker 400 to initiate a SAT solver, such as the SAT solver 474, to inspect a CNF formula.

The model checker 400 may further comprise an invariant extractor module 410 for extracting an invariant, such as a delta invariant, from a proof of unsatisfiability. The model checker 400 may utilize the invariant to extend the proof of unsatisfiability to prove the specification property holds for the model with a higher bound on the number of cycles or for an unbounded model. In some exemplary embodiments of the disclosed subject matter the invariant extractor module 410 may be configured to determine whether a proof is delta extendible without extracting an invariant.

In some exemplary embodiments of the disclosed subject matter, the invariant extractor module 410 may comprise a proof visitor 430. The proof visitor 430 may iterate or otherwise traverse over a portion of the nodes of a proof, such as a proof that is given in a DAG form. The proof visitor 430 may further comprise a visited set 435 for collecting all nodes that have been visited by the proof visitor 430. In some exemplary embodiments of the disclosed subject matter, the proof visitor 430 may initially inspect a root node of the proof, such as for example 210 of FIG. 2. After inspecting a node of the proof, also referred to as visiting the node, the proof visitor may add the node to the visited set 435.

In some exemplary embodiments of the disclosed subject matter, the invariant extractor module 410 may further comprise a delta shifter 420 for determining a second clause substantially equivalent to a first clause. The first and second clauses are said to be substantially equivalent if they have the same limitations over the state of the model. The first and second clause may differ by the cycle of the model to which they each refer. For example, in a model having two variables, a and b, a first clause (a__5, −b__7) is substantially equivalent to a second clause (a__9, −b__11) as the first and second clauses limit the state of the model such that at least one of the following is held: a is true in a predetermined cycle or b is false in two cycles after the predetermined cycle. In some exemplary embodiments, the delta shifter 420 may determine a substantially equivalent clause to a first clause (a__3, b__2) shifted by delta cycles by updating an index of the literals in the first clause by delta. For example, in case the delta is 2, a literal a__3 is shifted by 2 cycles, to produce a__5. A literal b__2 is also shifted by 2 cycles and a literal b__4 is produced. A clause that is shifted by 2 cycles, such as (a__5, b__4) may be determined.

In some exemplary embodiments of the disclosed subject matter, the invariant extractor module 410 may further comprise a delta chooser 440 for determining a delta. The delta may be used by the delta shifter 420 and by the invariant extractor module 410 to extract or otherwise determine a delta invariant appearing in a proof. In some exemplary embodiments, the delta chooser 440 may determine the delta based on an iteration over possible deltas, such as for example, all positive integers. In other exemplary embodiments, the delta chooser 440 may receive an indication from a user 445, such as the user 135 of FIG. 1. The indication may be the delta, or a set of possible deltas to choose from.

In some exemplary embodiments of the disclosed subject matter, the invariant extractor module 440 may further comprise a node identifier 450 for classifying or otherwise provide a taxonomy of a portion of a node of the proof. The node identifier 450 may determine whether a node is a conclusion based on one or more other clauses. In an exemplary embodiment, the node identifier 450 determines a node to be a conclusion based in case the node has an at least one outgoing edge in the DAG representation of the proof. The node identifier 450 may further determine whether a node is associated with an initial axiom clause or with a transition axiom clause. In an exemplary embodiment, the node identifier 450 compares a clause with all initial axiom clauses to determine if the clause is an initial axiom clause. In another exemplary embodiment, the node identifier 450 flags or otherwise indicates each leaf in the DAG representation of the proof as to its origin—whether it originates in an initial axiom clause or a transition relation clause. It will be noted that the aforementioned exemplary methods of classifying nodes may be applied to any type of node.

In some exemplary embodiments of the disclosed subject matter, the model checker 400 further comprises a proof reordering module 480. The proof reordering module 480 may reorder a proof, such as a proof of unsatisfiability. In some exemplary embodiments, the proof reordering module 480 may decrease a size of a proof representing a series of deductions by determining a different order of deductions. In an exemplary embodiment, the proof reordering module 480 may comprise a comb extractor module (not shown) to identify a comb of the proof. The reordering may be performed based on a list of deductions represented by the comb. In some exemplary embodiments, the reordering module 480 may further comprise an ordering function module for determining an order between two or more clauses based on a predetermined ordering function. An exemplary ordering function may be alphanumerical order. Another exemplary ordering function may be a temporal ordering function which determines a first clause to be before a second clause based on a first cycle number associated with the first clause and a second cycle number associated with the second clause. For example, the ordering function may determine that a clause associated with a first clause appearing before a second cycle to be ordered before a second clause associated with the second cycle. In an exemplary embodiment, the ordering function may determine an inverse order of the aforementioned. A reordering function may rearrange the proof by the natural temporal order (e.g., a clause associated with a first cycle appearing before a clause associated with a second cycle; the second cycle is after the first cycle). It will be noted that such a reordering function may be useful for decreasing a size of the proof as in many models, a relatively big portion of the state of the model in a cycle is determined by a portion of the model in a previous cycle. As the model may be a CNF formula of a bounded model that comprises one or more unique transition relation clauses for a transition from a cycle to a next cycle, the aforementioned reordering function may be decrease significantly the size of the proof. In yet another exemplary embodiment, the predetermined ordering function is determined by a user such as the user 445. In some exemplary embodiments the proof reordering module may perform a method similar to one described by FIG. 7.

Figure 5:
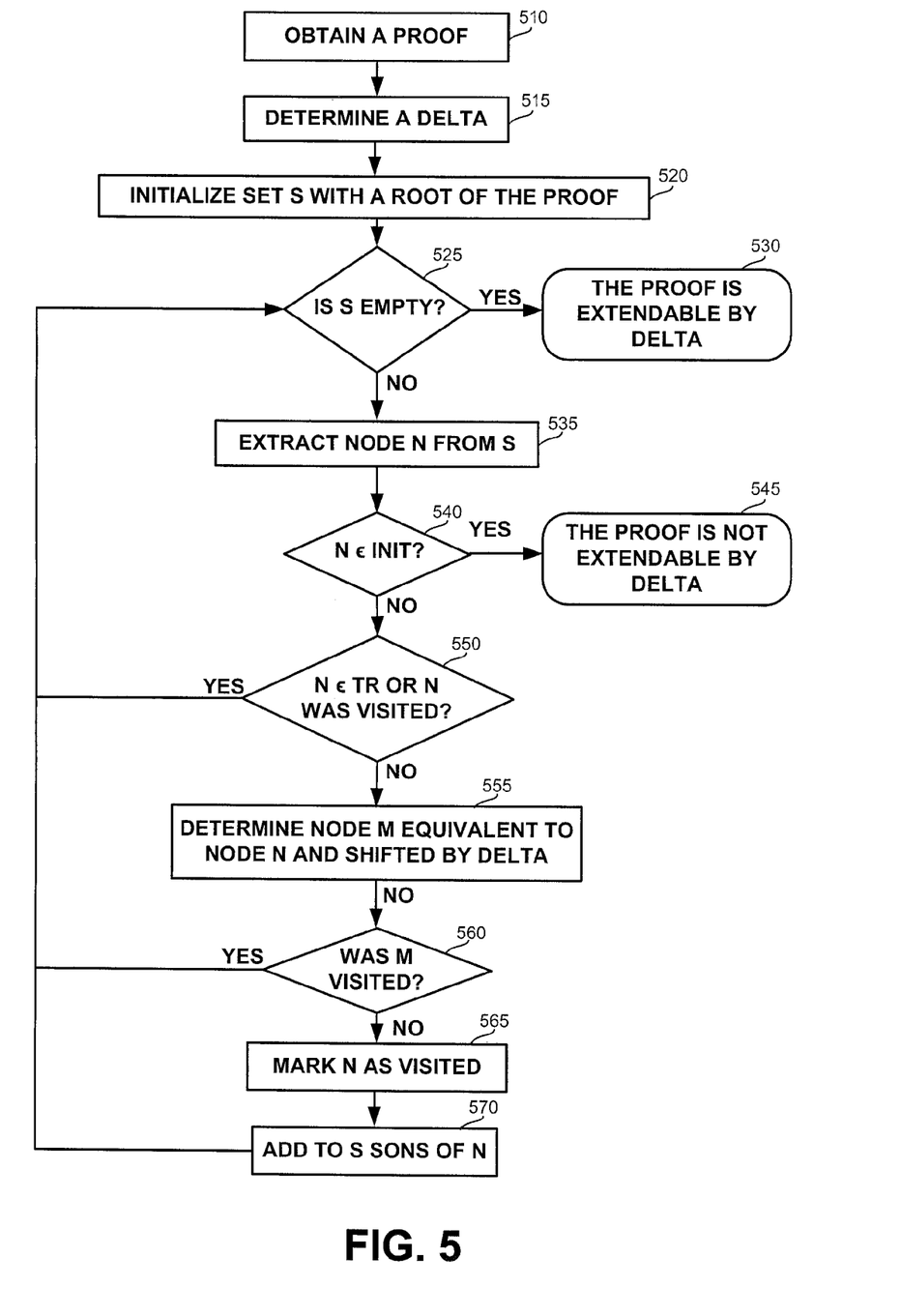
FIG. 5 shows a flowchart diagram of a method determining whether a proof is delta extendable, in accordance with some exemplary embodiments of the disclosed subject matter.

Referring now to FIG. 5 showing a flowchart diagram of a method determining whether a proof is delta extendable, in accordance with some exemplary embodiments of the disclosed subject matter.

In step 510, a proof is obtained. In some exemplary embodiments, the proof is of a DAG form. In other exemplary embodiments, the proof may be of other equivalent forms that encapsulate the information required by the disclosed method to determine whether the proof is delta extendable. In some exemplary embodiments, the proof deduces a conclusion of unsatisfiability. In other exemplary embodiments, the proof deduces a conclusion of satisfiability, such as for example, a partial assignment to the CNF formula. In some exemplary embodiments, the proof is obtained from a SAT solver, such as 474 of FIG. 4, a BMC, such as 470 of FIG. 4 or the like.

In step 515, a delta is determined. In some exemplary embodiments, the delta may be determined based on an input or other indication by a user. In other exemplary embodiments, the delta is selected from a set of possible deltas, such as all positive integers, a bounded set of positive integers or the like.

In step 520 a set of nodes denoted by S is initialized to include the root node of the proof. In some exemplary embodiments, the root node of the proof is the conclusion of that the CNF formula is unsatisfiable. In some exemplary embodiments, additional initializations may be performed, such as for example initializing a visited set such as 435 of FIG. 4.

In step 525 the set S is inspected to determine whether it is empty. In case the set is empty, step 530 is performed. Otherwise, step 535 is performed.

In step 530, in response to determining that the set S is empty, a determination is made that the proof is extendable by delta.

In step 535, in response to determining that the set S is not empty, a node is extracted from the set S. The node is denoted by N. In some exemplary embodiments of the disclosed subject matter, the node N is selected based on temporal considerations, such as having a literal associated with an early or late cycle. For example, it may be desired to first inspect a node of the proof that is associated with a later cycle than inspecting a node associated with an early cycle. It will be noted that the selection of N is not limited to the aforementioned considerations. It may be random, based on alphanumeric order or any other ordering function.

In step 540 a determination is made whether node N is associated with an init axiom clause. The determination may be performed by a node identifier, such as 450 of FIG. 4.

In step 545, in response to determining that the node N is associated with an init axiom clause, a determination is made that the proof is not delta extendible by the delta selected or otherwise determined in step 515. It will be noted that the determination is that the exemplary embodiment did not determine that the proof is delta extendible. It should not be construed as a formal proof that the proof is not delta extendible, rather as a determination that the exemplary embodiment is unable to determine that it is delta extendible.

In step 550, in response to determining that the node N is not associated with an init axiom clause, the node N is inspected again to determine whether the node N was previously visited or otherwise traversed by the present method. An additional determination is made to determine whether the node N is associated with a transition axiom clause. In case the node N was previously traversed or the node N is associated with a transition axiom clause, the node N is determined not to hinder the proof from being delta extendible, as opposed to a node that is associated with an init axiom clause. In case the node N does not hinder the proof from being delta extendible, step 525 is performed again.

In step 555, in response to determining that the node N is not associated with a transition axiom clause nor the node N was previously visited, another node M is determined. Node M is the node N shifted by delta cycles. In some exemplary embodiments, a delta shifter such as 420 of FIG. 4, may determine node M based on the node N and the delta.

In step 560 a determination is made whether the node M was previously visited or otherwise traversed. In case the node M was visited, the node N is determined not to hinder the proof from being delta extendible, and step 525 is performed.

In step 565, in response to determining that node M was not previously visited, node N is marked as a visited node. In some exemplary embodiments, a visited set 435 may be utilized to indicate which nodes have been visited or otherwise traversed.

In step 570, any son node of the node N may be added to the set S. A first node is a son node of a second node in case an outgoing edge from the second node to the first node exists. Afterwards, step 525 is preformed and consequently the son nodes will be also traversed (though not necessarily immediately after the node N).

In some exemplary embodiments of the disclosed subject matter, a proof visitor, such as 420 of FIG. 4, is utilized to traverse a portion of the nodes of the proof by first traversing a node and in response to determining that the sons nodes should also be traversed, traversing the son nodes. The proof visitor may perform a portion of the steps 525, 535, 565 and 570.

Although the exemplary disclosed method may end in steps 530, some exemplary embodiments of the disclosed subject matter may not end but rather proceed to step 515 for selecting a second delta. A determination is made whether the proof is delta extendible by the second delta. In some exemplary embodiments of the disclosed subject matter, the method may proceed after determining in step 530 that the proof is delta extendible by delta to inspect whether or not the proof is also extendible by a second delta. Such an exemplary method is exemplified below in respect to FIG. 6.

In some exemplary embodiments of the disclosed subject matter, an additional initialization step may be performed in order to decrease a size of the DAG representing the proof. In an exemplary embodiment, the proof may be reordered such that a conclusion remains unchanged, but the proof has a different topology. In an exemplary embodiment, the proof may be reordered such the conclusion remains unchanged, but the clauses that are used to deduce the conclusion are of different scope than those of the original proof. A scope of a clause is determined by a number of states it represents. Therefore, having a different amount of literals in a first clause than an amount of literals in a second clause, the first and second clauses are said to have a different scope. In an exemplary embodiment, the different scope is a bigger scope. For example, a clause in the original proof has more literals than a clause in the second proof. In some exemplary embodiments, all clauses in the reordered proof have a number of literals that is equal to or lower than a number of literals in an equivalent clause in the original proof.

Figure 6:
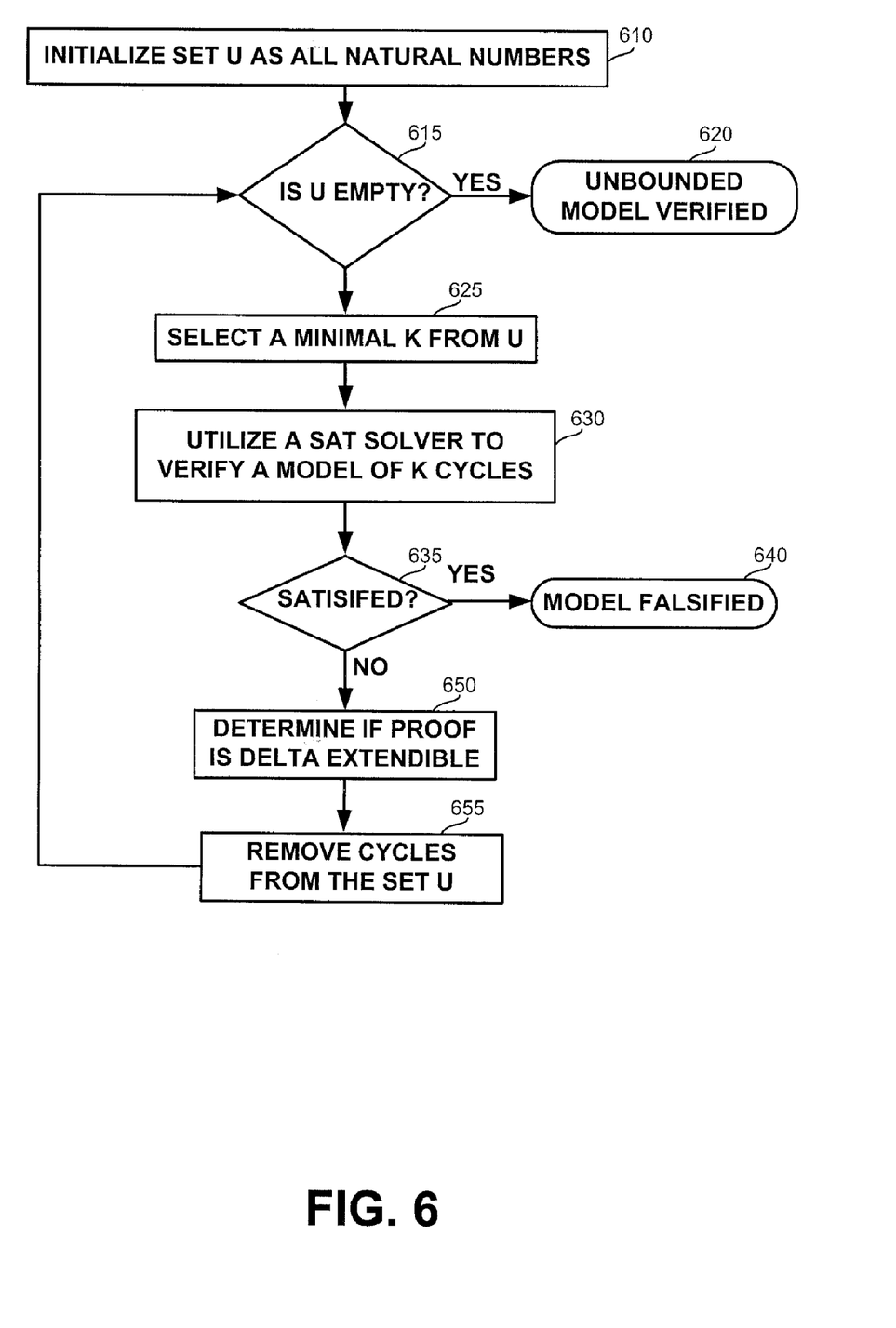
FIG. 6 shows a flowchart diagram of a method verifying an unbounded model in respect to a specification property in accordance with some exemplary embodiments of the disclosed subject matter.

Referring now to FIG. 6 showing a flowchart diagram of a method verifying an unbounded model in respect to a specification property in accordance with some exemplary embodiments of the disclosed subject matter. The method determines whether an unbounded model holds a specification property by first proving the specification property holds for a bounded model and by extending the proof to correspond to cycles that are after the bound on the number of cycles.

In step 610, a set denoted by U is initialized with all natural numbers. The set U may be an infinite set. The set U may correspond to all cycle numbers for which the specification property should be verified.

In step 615, a determination is made whether the set U is empty.

In step 620, in case the set U is empty, the model is determined to be verified in respect to the specification property.

In step 625, in response to determining that the set U is not empty, a bound on the number of cycles may be selected from the set U. The bound is denoted by K. In some exemplary embodiments, the bound K is selected as a minimal integer in the set U. In other exemplary embodiments, the bound K is selected in a different manner such as for example, by randomly selecting the bound K from the set U.

In step 630, a SAT solver is utilized to verify a bounded model having a bound on the number of cycles of the bound K. A CNF formula constructor such as 472 of FIG. 4 may determine a CNF formula based on the bounded model and the specification property. In some exemplary embodiments, the CNF formula may be satisfied only in case the specification property is not held in cycle K. In other exemplary embodiments, the CNF formula may be satisfied only in case the specification property is not held in any cycle up to cycle K.

In step 635, a determination is made whether the CNF formula is satisfied.

In step 640, in response to determining that the CNF formula is satisfied, the model is determined not to hold the specification property. In some exemplary embodiments, a satisfying assignment produced by the SAT solver may be utilized to determine a counter-example exemplifying a behavior of the model in which the specification property does not hold.

In step 650, in response to determining that the bounded model holds the specification property, a proof of unsatisfiability may be examined to determine if it is delta extendable.

In some exemplary embodiments, the SAT solver provides the proof of unsatisfiability. The proof may be in DAG form. In some exemplary embodiments, multiple determinations may be made to determine whether the proof is delta extendable by various deltas, such as for example 2 and 3.

In step 655, cycles that have been proven to hold the specification property may be removed from the set U. The bound K may be removed from the set U. In case the CNF formula is designed to be satisfied in case the specification property does not hold for any cycle up to cycle K, all the numbers that lower than the bound K may also be removed. In case the proof is delta extendable by delta, additional cycles may be removed. The additional cycles may be cycles whose numbering is K+delta*I, where I is a positive integer. The additional cycles may be an infinite set of numbers that may be removed from the set U.

In an exemplary embodiment of the disclosed subject matter, the method may determine that models of bounds one, two and three hold the specification property and are not delta extendible by any delta. Thus the set U may comprise all integers greater than three. The method may further determine that the specification property is held for bound four as well and that the proof is delta extendible by two. Thus, all even numbers may be removed in step 655 from the set U. The method may further yet determine that the specification property is held for bound five and that the proof is also delta extendible by two. Thus, all additional odd numbers may be removed from the set U. Therefore, set U may be empty and a determination may be made that the unbounded model holds the specification property.

Figure 7:
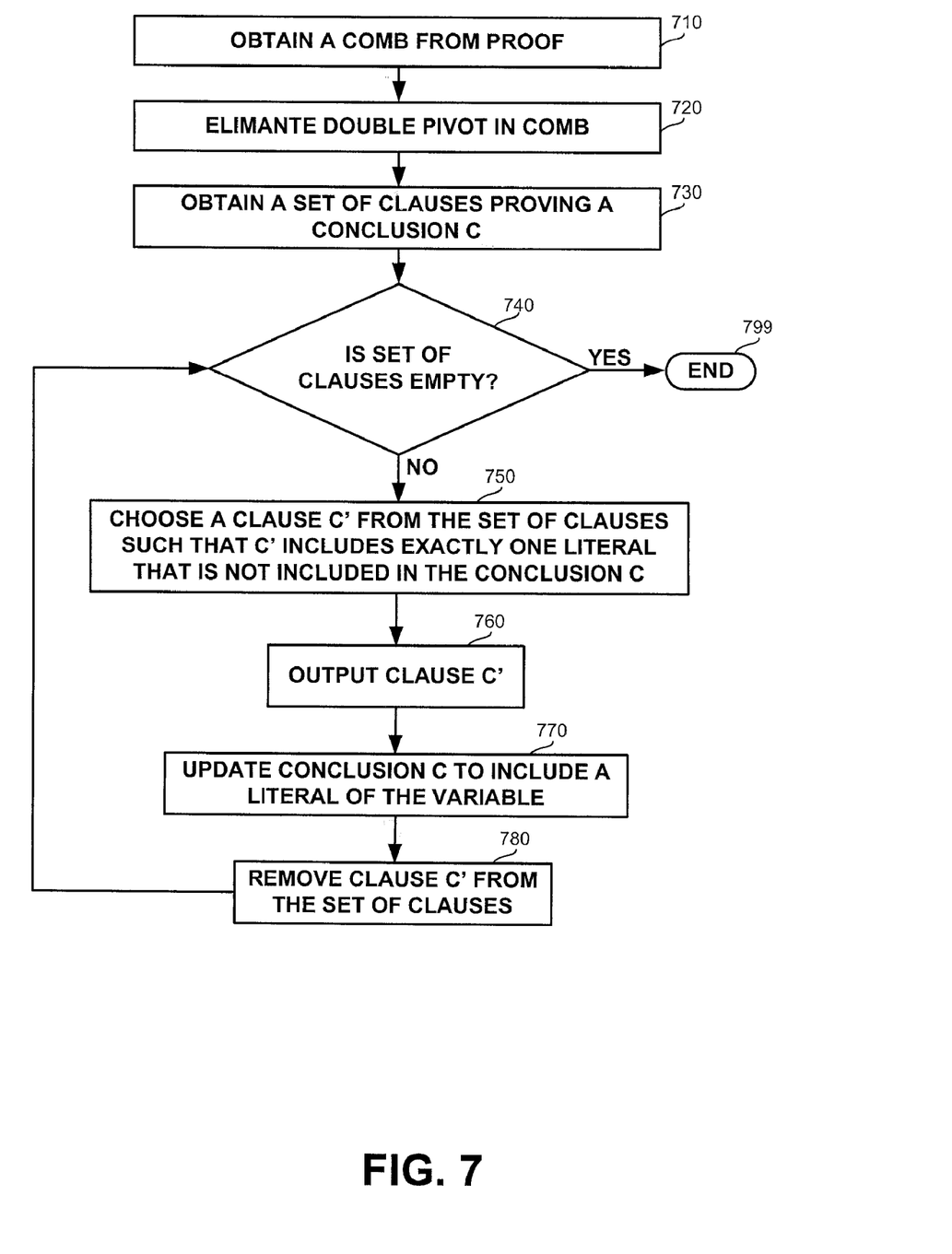
FIG. 7 shows a flowchart diagram of a method of reordering the order of deductions in a proof, in accordance with some exemplary embodiments of the disclosed subject matter.

Referring now to FIG. 7 showing a flowchart diagram of a method of reordering the order of deductions in a proof, in accordance with some exemplary embodiments of the disclosed subject matter.

In step 710 a comb of a proof is obtained. In an exemplary embodiment of the disclosed subject matter, the comb is received from an external module, from a user or the like. In an exemplary embodiment, an additional step in which the comb is extracted from the proof is performed.

In step 720, in case the comb comprises two or more resolutions which are based on the same pivot variable, one of the resolutions may be removed and the comb may be rebuilt to include only a single resolution that is associated with the pivot variable.

In step 730, a set of clauses proving the conclusion C is obtained from the comb, based on the clauses associated with the nodes of the comb. The conclusion C may be an empty clause representing unsatisfiability.

In step 740, in case the set is empty step 799 is performed. In case set is not empty, step 750 is preformed.

In step 750, a clause denoted by c' is selected from the set of clauses. In an exemplary embodiment, the clause c' is characterized in that it comprises exactly one literal that is not included in the conclusion clause, also referred to as the pivot literal. For example, if the conclusion clause is (a,−b,c), one of the following clauses may be chosen as c' in the step 750: (a,d), (a,c,−d), (a,−b,−d), (a,−b,c,d) as they all have a portion of the literals in the conclusion clause and an additional literal. The one literal may be a literal that is not comprised in the conclusion clause and nor is an opposite literal comprised in the conclusion clause.

In some exemplary embodiments of the disclosed subject matter, in case more than one c' clauses exists, it is chosen based on a predetermined ordering function relating to the additional literal. Some exemplary ordering functions may be an arbitrary order of each variable, increasing or decreasing cycle number, an arbitrary order based on the variable in the model associated with the literal, an ordering function that is indifferent of cycling numbering and the like.

In step 760 clause c' is determined to be part of the new proof. The order in which the clauses are outputted may be utilized to determine the order of a new proof based on the outputted clauses.

In step 770, the conclusion c is updated to include a literal that is opposite to the pivot literal. The updated conclusion c is characterized such that a resolution between the updated conclusion c and the clause c' deduces the conclusion c.

In step 780 the clause c' is removed from the set of clauses. The method ends in step 799.

The aforementioned method is complete and produces a valid proof. The produced valid proof may be smaller than the original size of the proof. In some exemplary embodiments, the produced valid proof is significantly smaller than the original proof and therefore a method which utilizes a proof, such as the one disclosed in regards to FIG. 5, may be performed more efficiently, such as for example, performed faster, requiring less memory space or otherwise performing in a similar manner while utilizing fewer resources.

In some exemplary embodiments of the disclosed subject matter, a conclusion c of an original comb is not unsatisfiabilty (the empty clause) but rather a conclusion clause comprising one or more literals, also referred to as one or more conclusion literals. In such exemplary embodiments, the method may further comprise a step of determining a modified comb based on the original comb. The modified comb comprises clauses that deduce a conclusion of unsatisfiability. The modified comb may comprise a first clause associated with a second clause of the original comb. The first clause comprises a portion of the literals of the second clause. The first clause may comprise a portion of the literals of the second clause such that it does not comprise a conclusion literal or a literal opposite to a conclusion literal.

In some exemplary embodiments of the disclosed subject matter, a comb reordering is performed iterataviley. In an iteration, a comb of the proof is reordered. The iterative process may be performed until a state of the proof is stable and additional reordering of any comb may not change the structure of the proof. For example, in an exemplary proof there may be ten combs. A first comb may be reordered, resulting in a modified proof comprising a different number of combs. In case an order of a comb is in accordance with an ordering function used by the disclosed subject matter, the comb may not be modified. It will be noted that given a deterministic ordering function, the exemplary iterative process reaches a stable state after a finite number of iterations.

Figure 8:
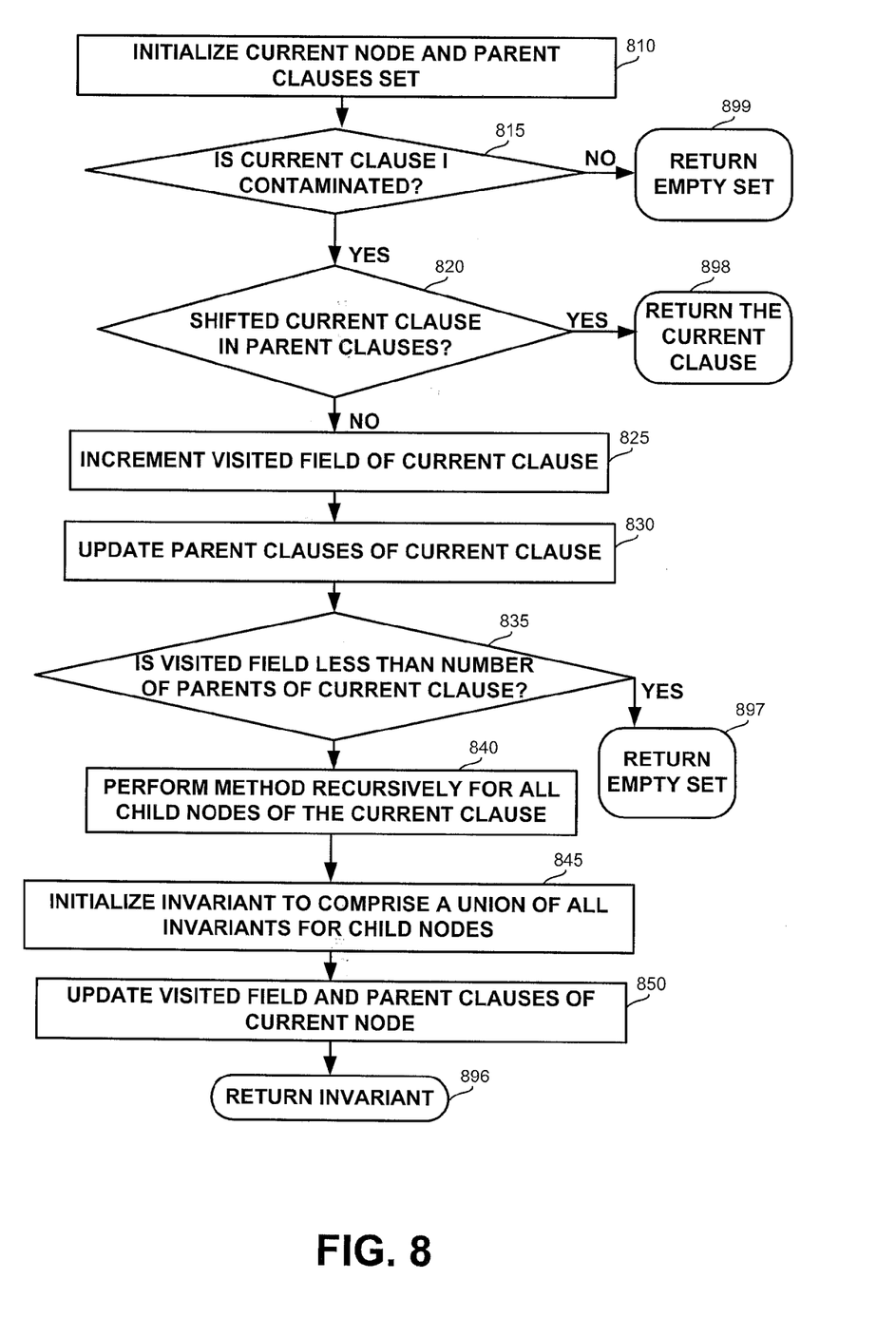
FIG. 8 shows a flowchart diagram of a method of extracting an invariant from a proof, in accordance with some exemplary embodiments of the disclosed subject matter.

Referring now to FIG. 8 showing a flowchart diagram of a recursive method of extracting an invariant from a proof, in accordance with some exemplary embodiments of the disclosed subject matter In step 810 a current node and a parent clauses set are initialized in accordance with a parameter passed to the exemplary recursive method. The exemplary recursive method may receive in a first execution a parameter such that the current node is initialized to be a conclusion of the proof and the parent clauses set is initialized to be an empty set. It will be noted that the current node in the present specification may refer to the node in the proof or to the clause associated with the node interchangeably.

In step 815, a determination is made whether the current clause is I contaminated. A first clause is said to be I contaminated if there exists a route in the proof from the first clause to a second clause, where the second clause is an initial axiom clause. In case the current clause is not I contaminated, the exemplary recursive method does not extract any invariant from the proof and step 899 is performed. In case the current clause is I contaminated, step 820 is performed.

In step 899, in response to determining that the current clause is not I contaminated, the exemplary recursive method ends without extracting an invariant from the proof. In some exemplary embodiments, an empty set may be returned to represent not extracting any invariant.

In step 820, in response to determining that the current clause is I contaminated, a determination is made whether a shifted clause is a member of the parent clauses set. The shifted clause is a clause this is a clause equivalent to the current clause and shifted by delta cycles. In an exemplary embodiment, the shifted clause is shifted by one cycle, enabling extraction of an invariant that is associated with every cycle larger than a predetermined bound associated with a model associated with the proof. In case the shifted clause is a member of the parent clauses set, step 898 is performed. Otherwise, step 825 is performed In step 898, in response to determining that the shifted clause is a member of the parent clauses set, an invariant is returned. The invariant is the current clause.

In step 825, in response to determining that the shifted clause is not a member of the parent clauses set, a visited field of the current clause is incremented by one. The visited field may be utilized to determine a number of times a node of the proof was visited by a method. It will be noted that the visited field may be utilized to enforce a predetermined order of visitation of nodes, such as for example a Depth-First Search (DFS) order.

In step 830, a parent clauses field of the current node may be updated. The parent clauses field may comprise a set of clauses that may be used to deduce the current clause. The parent clauses field may be updated to further comprise the clauses in the parent clauses set. In some exemplary embodiments, the parent clauses field may be updated only in case the current clauses has at most one I contaminated children node.

In step 835, a determination is made whether the visited field is less than a number of parents of the current clause. In response to determining that the visited field is less than the number of parent, step 897 is performed. Otherwise, step 840 is performed. It will be noted that the step 835 may be utilized to enforce a predetermined order of visiting nodes of the proof, such as for example a DFS order.

In step 897, in response to determining that the current clause was visited a number of times which is less than the number of parents of the current clause, the method may end. An empty set may be returned representing no invariant was extracted from the current clause.

In step 840, the exemplary recursive method initiates itself recursively. The method is performed for each child node of the current clause. For each such child node, a parameter is passed such that the current clause will be initialized in step 810 to be the child node, and the parent clauses set will be initialized in step 810 to be the parent clauses of the current node. In some exemplary embodiments the parent clauses of the current node are the updated parent clauses of the current node, as updated in step 830.

In step 845 an invariant is initialized to comprise a union of at least one invariant determined in step 840 in respect to the children nodes of the current clause.

In step 850, the visited field of the current clause may be set to zero or otherwise reset. The parent clauses of the current clause may also be reset, for example by being set to be an empty clause.

In step 896, the invariant initialized in step 845 is returned as a result. The invariant is a set of one or more clauses that are held every delta cycles, such as for example every one cycle, every two cycles or the like.

It will be noted that the aforementioned exemplary recursive method may be modified to not be a non-recursive method which provides the same result as the exemplary recursive method.

In some exemplary embodiments of the disclosed subject matter, an unbounded model checking process may utilize the exemplary recursive method or other similar methods which extract an invariant from a proof. For example, the model checking process may initially utilize a SAT solver to determine whether a specification property holds for a first bounded model associated with an unbounded model. The first bounded model comprises one or more transition relation axiom clauses and an invariant axiom. Initially, the invariant axiom may not comprise any clauses. In case the specification holds, the unbounded model is proven. Otherwise, the SAT solver is utilized to determine whether the specification property holds for a second bounded model. The second bounded model comprises the one or more transition relation axiom clauses, the invariant axiom and a one or more initial axiom clauses. In case a satisfying assignment is determined, the unbounded model is falsified and a counterexample may be determined. In case the specification holds, the proof of unsatisfiability may be reordered in accordance with the disclosed subject matter. An invariant may be extracted from the reordered proof and added the invariant axiom. The bound on number of cycles may or may not be increased non-deterministically. The method may perform the aforementioned steps iteratively until either a the unbounded model is proven or falsified.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computerized system comprising:
   a processor;
   an interface for receiving a proof of a conclusion associated with a CNF formula, the CNF formula representing a model and a specification property in a predetermined number of cycles,
   the proof comprising an initial axiom clause, a transition axiom clause, at least one deduction clause, and a conclusion clause defining the conclusion, the conclusion clause being one of the at least one deduction clause,
   wherein each of at least one deduction clause is derived from at least two other clauses of the proof; and
   an invariant extractor module for identifying an invariant in the proof, the invariant is a portion of the proof;
   said invariant extractor module utilizes said processor for identifying the invariant.

2. The computerized system of claim 1 wherein:
   the proof of a conclusion is a proof of unsatisfiability;
   said invariant extractor module further comprises a delta shifter module;
   said delta shifter module receives a first clause associated with a first cycle and a predetermined number of cycles and determines a second clause associated with a second cycle; the second clause is substantially equivalent to the first clause;
   the difference between the first cycle and the second cycle is the predetermined number of cycles.

3. The computerized system of claim 2 wherein:
   said invariant extractor module further comprises a proof visitor module for traversing the proof of unsatisfiability; said proof visitor comprises a set of one or more visited clauses; said proof visitor module utilizes said delta shifter module to determine whether the set of one or more visited clauses comprises a first clause that is substantial equivalent to a second clause.

4. The computerized system of claim 3 wherein:
   said invariant extractor module further comprising a node identifier module for identifying an initial axiom clause, a transition axiom clause and a deduction clause.

5. The computerized system of claim 2 wherein said invariant extractor module further comprises a delta chooser module for determining a predetermined number of cycles, the predetermined number of cycles utilized by the delta shifter.

6. The computerized system of claim 1 wherein
   said invariant extractor module further comprises a proof reordering module for reordering the proof.

7. The computerized system of claim 1, wherein the invariant comprises one or more deduction clauses.

8. A computerized system comprising:
   a processor;
   an interface for receiving a proof of a conclusion associated with a CNF formula, the CNF formula representing a model and a specification property in a predetermined number of cycles,
   the proof comprising an initial axiom clause, a transition axiom clause, at least one deduction clause, and a conclusion clause defining the conclusion, the conclusion clause being one of the at least one deduction clause,
   wherein each of at least one deduction clause is derived from at least two other clauses of the proof; and
   an invariant extractor module for identifying an invariant in the proof, the invariant is a portion of the proof;
   said invariant extractor module utilizes said processor for identifying the invariant,
      wherein the proof of a conclusion is a proof of unsatisfiability;
      said invariant extractor module further comprises a delta shifter module, said delta shifter module receives a first clause associated with a first cycle and a predetermined number of cycles and determines a second clause associated with a second cycle, the second clause is substantially equivalent to the first clause; the difference between the first cycle and the second cycle is the predetermined number of cycles,
      said invariant extractor module further comprises a proof visitor module for traversing the proof of unsatisfiability, said proof visitor comprises a set of one or more visited clauses; said proof visitor module utilizes said delta shifter module to determine whether the set of one or more visited clauses comprises a first clause that is substantial equivalent to a second clause,
      said invariant extractor module further comprising a node identifier module for identifying an initial axiom clause, a transition axiom clause and a deduction clause, and
      said invariant extractor module further comprises a delta chooser module for determining a predetermined number of cycles; the predetermined number of cycles is utilized by said delta shifter.

9. The computerized system of claim 8 further comprising:
   a CNF formula constructor for determining the CNF formula based on the model and the specification property.

10. The computerized system of claim 9 further comprising:
    a SAT solver for determining unsatisfiability of the CNF formula.

11. The computerized system of claim 9 wherein said invariant extractor module is configured to extract an invariant from the proof of unsatisfiability.

12. The computerized system of claim 9 wherein the proof is a proof of unsatisfiability, said proof reordering module is a temporal proof reordering modules, said temporal proof reordering module is configured to reorder the proof of unsatisfiability in respect to a temporal consideration.

13. A computer-implemented method comprising:
    obtaining a proof of a conclusion associated with a CNF formula, the CNF formula representing a model and a specification property in a first predetermined number of cycles, the proof comprising an initial axiom clause, a transition axiom clause, at least one deduction clause, and a conclusion clause defining the conclusion, the conclusion clause being one of at least one deduction clause,
    wherein each of at least one deduction clause is derived from at least two other clauses of the proof;
    identifying an invariant in the proof; said identifying an invariant in the proof is performed by a processor; and
    determining the specification property holds for the model in a second predetermined number of cycles based on the invariant,
    whereby the proof of the conclusion associated with the CNF formula is transformed to provide a proof of the conclusion associated with an extended CNF formula representing the model and the specification property in the second predetermined number of cycles, and wherein said obtaining, identifying or determining is performed by a computer machine.

14. The method of claim 13 wherein said identifying an invariant in the proof comprises:
traversing the proof and collecting a set of visited clauses; the set of visited clauses comprises transition axiom clauses and deduction clauses.

15. The method of claim 14 wherein said traversing the proof further comprising:
determining a first clause associated with a first cycle that is substantially equivalent to a second clause associated with a second cycle; the different between the first cycle and the second cycle is a predetermined number of cycles.

16. The method of claim 15 further comprising determining the predetermined number of cycles.

17. The method of claim 14 wherein said identifying an invariant in the proof comprises identifying a delta invariant in the proof.

18. The method of claim 17 wherein identifying a delta invariant in the proof is performed iteratively until a delta invariant is identified.

19. The method of claim 17 further comprising:
determining the specification property holds for the model in another number of cycles based on the delta invariant.

20. The method of claim 17 further comprising iteratively identifying a delta invariant in the proof until the specification property is determined to hold for the model in an unbounded number of cycles.

21. The method of claim 17 further comprises reordering the proof.

22. The method of claim 21 wherein reordering the proof comprising determining a clause is associated with a cycle; and reordering the proof based on an order of cycles.

23. The method of claim 13 further comprising:
extracting the invariant identified in said identifying an invariant in the proof; and
wherein said determining the specification property holds for the model in a second predetermined number of cycles based on the invariant comprises determining a second CNF formula associated with the model; the second CNF formula comprises an invariant clause and a transition axiom clause; the invariant clause is associated with the invariant.

24. The method of claim 23 wherein the second CNF formula further comprising an init axiom clause.

25. A computer program product comprising:
a non-transitory computer readable medium;
first program instruction for receiving a proof of a conclusion associated with a CNF formula, the CNF formula representing a model and a specification property in a first predetermined number of cycles, the proof comprising an initial axiom clause, a transition axiom clause, at least one deduction clause, and a conclusion clause defining the conclusion, the conclusion clause being one of the at least one deduction clause,
wherein each of at least one deduction clause is derived from at least two other clauses of the proof;
second program instruction for identifying an invariant in the proof, said identifying an invariant in the proof is performed by a processor; and
third program instruction for determining the specification property holds for the model in a second predetermined number of cycles based on the invariant,
wherein said first, second, and third program instructions are stored on said non-transitory computer readable media.

* * * * *